(12) United States Patent
Lin (10) Patent No.: US 9,503,067 B1
(45) Date of Patent: Nov. 22, 2016

(54) TIME SHIFTER AND METHOD THEREOF

(71) Applicant: REALTEK SEMICONDUCTOR CORPORATION, HsinChu (TW)

(72) Inventor: Chia-Liang (Leon) Lin, Fremont, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/746,040

(22) Filed: Jun. 22, 2015

(51) Int. Cl.
*H03K 5/159* (2006.01)
*H03K 19/0948* (2006.01)
*H03K 5/00* (2006.01)

(52) U.S. Cl.
CPC .......... *H03K 5/159* (2013.01); *H03K 19/0948* (2013.01); *H03K 2005/00058* (2013.01)

(58) Field of Classification Search
CPC .......................... H03K 5/159; H03K 19/0948
USPC .......................................................... 326/98
See application file for complete search history.

(56) References Cited

U.S. PATENT DOCUMENTS

| 6,411,147 B1* | 6/2002 | Casteel | H02M 7/1623 327/199 |
| 7,616,025 B1* | 11/2009 | Irving | H03K 19/17784 326/38 |
| 2003/0117176 A1* | 6/2003 | Tardieux | G06F 1/04 326/93 |
| 2007/0200597 A1* | 8/2007 | Oakland | H03K 5/15013 326/46 |
| 2014/0223220 A1* | 8/2014 | Guntur | G06F 1/12 713/501 |
| 2015/0188527 A1* | 7/2015 | Francom | H03K 5/14 327/158 |

* cited by examiner

*Primary Examiner* — Dylan White
(74) *Attorney, Agent, or Firm* — Sughrue Mion, PLLC (57) ABSTRACT

A circuit includes first and second gated buffers, respectively receiving and outputting logic signals, including a delayed signal. A finite state machine receives the delayed signal and a clock signal and assumes first or second machine states. The first gated buffer is conditionally enabled based on a state of the finite state machine, while the second gated buffer is enabled regardless of the state of the finite state machine. A method includes receiving and generating logic signals via first and second gated buffers, including a delayed signal. The method includes receiving the delayed signal and a clock signal in a finite state machine. The method further includes enabling the first gated buffer depending on whether the state machine is in a first or a second machine state, and enabling the second gated buffer when the finite state machine is either in the first or the second machine state.

11 Claims, 8 Drawing Sheets

TIME SHIFTER AND METHOD THEREOF

BACKGROUND

Field

Apparatus and methods consistent with exemplary embodiments relate to time signal processing.

Description of Related Art

Persons of ordinary skill in the art understand terms and basic concepts related to microelectronics that are used in this disclosure, such as "voltage," "signal," "circuit," "logical signal," "clock," "trip point," "inverter," "buffer," "circuit node," "finite state machine," "data flip-flop," "multiplexer," "MOS (metal oxide semiconductor)," "PMOS (p-channel metal oxide semiconductor)," "NMOS (n-channel metal oxide semiconductor)," "CMOS (complementary metal oxide semiconductor)," "transistor," "source," "gate," "drain," and "CMOS inverter." Terms and basic concepts like these are apparent to those of ordinary skill in the art and thus will not be explained in detail here.

Through this disclosure, a logical signal is a signal of two states: "high" and "low," which can also be re-phrased as "1" and "0." For brevity, a logical signal in the "high" ("low") state is simply stated as the logical signal is "high" ("low"), or alternatively, the logical signal is "1" ("0"). Also, for brevity, quotation marks may be omitted and the immediately above is simply stated as the logical signal is high (low), or alternatively, the logical signal is 1 (0), with the understanding that the statement is made in the context of describing a state of the logical signal. A logical signal is embodied by a voltage; the logical signal is "high" ("low") when the voltage is above (below) an associated trip point of a recipient logical device that receives and processes the logical signal. For brevity, the associated trip point is simply referred to as the trip point of the logical signal. In this disclosure, the trip point of a first logical signal may not be necessarily the same as the trip point of a second logical signal.

If a logical signal is "high" (or "1") it is said to be "asserted." If the logical signal is "low," it is said to be "de-asserted."

A clock signal is a periodic logical signal.

A logical signal exhibits a rising (falling) edge when the logical signal undergoes a low-to-high (high-to-low) transition.

A time signal may include two constituent logical signals, including a first logical signal (denoted by a suffix "+" in a subscript) and a second logical signal (denoted by a suffix "−" in a subscript). The value of the time signal may include a time difference between the second logical and the first logical signal. For example, a time signal X may include two constituent logical signals $X_+$ and $X_-$, wherein $X_+$ has a rising edge at time $t_+$ and $X_-$ has a rising edge at time $t_-$. A value of the time signal is $t_- - t_+$.

Figure 1:
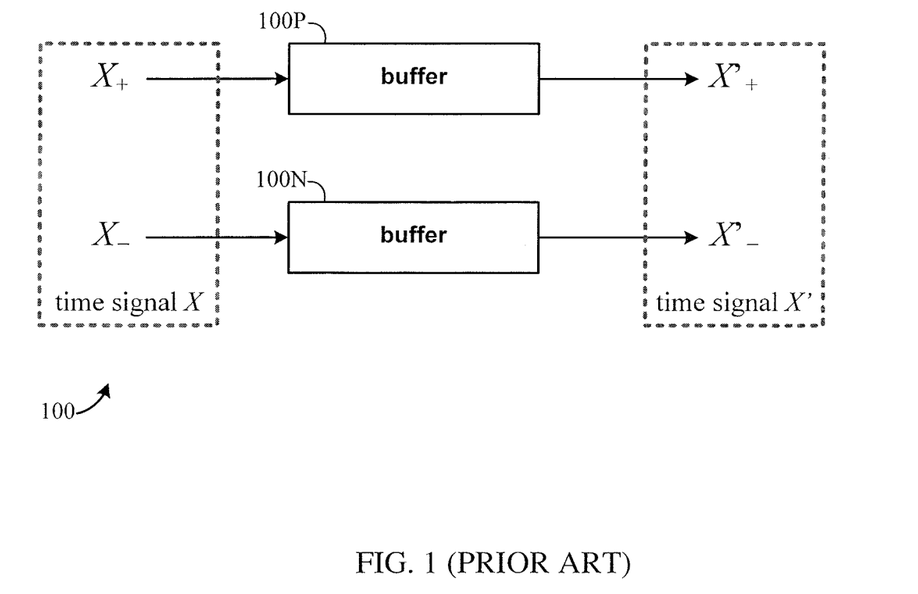
FIG. 1 shows a schematic diagram of a prior art time shifter.

A time shifter receives a time signal X and outputs an another time signal X' such that a value of the time signal X' is the same as a value of the time signal X. FIG. 1 shows a time shifter 100 including a first buffer 100P and a second buffer 100N. The time signal X includes two constituent logical signals $X'_+$ and $X'_-$, while the time signal X' includes two constituent logical signals $X'_+$ and $X'_-$. A buffer preserves a value of a signal but introduces a delay. Therefore, $X'_+$ is the same as $X_+$ except for a delay determined by the first buffer 100P. Likewise, $X'_-$ is the same as $X_-$ except for a delay determined by the second buffer 100N. As long as the first buffer 100P is substantially identical to the second buffer 100N, those of ordinary skill in the art can also recognize that a value of the time signal X' will be the same as a value of the time signal X. A time signal can be processed in various operations. For instance, a time signal can be amplified (using a time amplifier), and also can be quantized (using a time-to-digital converter). A time shifter allows a time signal to be processed at a later time. In many cases, it is desired that a time signal can be processed at a later time in accordance with a system clock. Using time shifter 100 of FIG. 1 can allow a time signal to be processed at a later time in accordance with a system clock, but only in an ad hoc manner, wherein a timing of the time signal relative to the system clock is pre-known to some extent. In this situation, a workable buffer can be chosen with pre-knowledge of the time signal relative to a system clock. A conventional time shifter is described in Hong et al., "A 0.004 mm² 250 μW ΔΣ TDC with time-difference accumulator and a 0.012 mm² 2.5 mW bang-bang digital PLL using PRNG for low-power SoC applications," presented in Solid-State Circuits Conference Digest of Technical Papers (ISSCC), 2012 IEEE International, pp. 240-242.

Apparatus and methods consistent with an inventive concept relate to a systematic way of shifting a time signal so as to be compatible with a system clock.

BRIEF SUMMARY

An aspect of the inventive concept is to shift a timing of a time signal in accordance with a clock signal.

In an exemplary embodiment, a circuit includes: a first gated buffer configured to receive a first logical signal and output a second logical signal; a second gated buffer configured to receive a third logical signal and output a delayed signal; and a finite state machine configured to receive the delayed signal and a clock signal, wherein the first gated buffer is configured to be conditionally enabled in accordance with a state of the finite state machine, while the second gated buffer is configured to be enabled regardless of the state of the finite state machine.

In an exemplary embodiment, the first gated buffer includes: a plurality of CMOS (complementary metal oxide semiconductor) inverters configured in a cascade topology; a PMOS (p-channel metal oxide semiconductor) transistor configured to couple the plurality of CMOS inverters to a power supply node; and a NMOS (n-channel metal oxide semiconductor) transistor configured to couple the plurality of CMOS inverters to a ground node, wherein the PMOS transistor and the NMOS transistor are configured to be conditionally turned on in accordance with the state of the finite state machine.

In an exemplary embodiment, the second gated buffer includes a plurality of CMOS (complementary metal oxide semiconductor) inverters configured in a cascade topology; a PMOS (p-channel metal oxide semiconductor) transistor configured to couple the plurality of CMOS inverters to a power supply node; and a NMOS (n-channel metal oxide semiconductor) transistor configured to couple the plurality of CMOS inverters to a ground node, wherein the PMOS transistor and the NMOS transistor are configured to be turned on regardless of the state of the finite state machine.

In an exemplary embodiment, the finite state machine enters a first state upon an edge of the clock signal, and enters a second state upon an edge of the delayed signal.

In an exemplary embodiment, the first gated butter is enabled when the finite state machine is in the first state, and disabled when the finite state machine is in the second state.

In a further embodiment, the circuit further includes a third gated buffer configured to receive the clock signal and output a fourth logical signal, wherein the third gated buffer is configured to be enabled regardless of the state of the finite state machine.

In a further embodiment, the first logical signal and the third logical signal are swapped before being received by the circuit.

In an exemplary embodiment, a method includes receiving a first logical signal, generating a second logical signal by propagating the first logical signal through a first gated buffer, receiving a clock signal; receiving a third logical signal; generating a delayed signal by propagating the third logical signal through a second gated buffer; placing a finite state machine in a first state upon an edge of the clock signal; and placing the finite state machine in a second state upon an edge of the delayed signal; wherein the first gated buffer is enabled when the finite state machine is in the first state but the first gated buffer is disabled when the finite state machine is in the second state, while the second gated buffer is enabled when the finite state machine is in the first state and when the finite state machine is in the second state.

In an exemplary embodiment, the first gated buffer includes: a plurality of CMOS (complementary metal oxide semiconductor) inverters configured in a cascade topology; a PMOS (p-channel metal oxide semiconductor) transistor configured to couple the plurality of CMOS inverters to a power supply node; and a NMOS (n-channel metal oxide semiconductor) transistor configured to couple the plurality of CMOS inverters to a ground node, wherein the PMOS transistor and the NMOS transistor are configured to be turned on when the finite state machine is in the first state but turned off when the finite state machine is in the second state.

In an exemplary embodiment, the second gated buffer includes a plurality of CMOS (complementary metal oxide semiconductor) inverters configured in a cascade topology; a PMOS (p-channel metal oxide semiconductor) transistor configured to couple the plurality of CMOS inverters to a power supply node; and a NMOS (n-channel metal oxide semiconductor) transistor configured to couple the plurality of CMOS inverters to a ground node, wherein the PMOS transistor and the NMOS transistor are configured to be turned on when the finite state machine is in the first state and when the finite state machine is in the second state.

In an exemplary embodiment, the method further includes swapping the first logical signal with the second logical signal upon receiving them.

In a further embodiment, the method further includes generating a fourth logical signal by propagating the clock signal through a third gated buffer that is turned on when the finite state machine is in the first state and when the finite state machine is in the second state.

DETAILED DESCRIPTION

Exemplary embodiment of the inventive concept relate to a time shifter. While the specification describes several exemplary embodiments considered as modes of practicing the inventive concept, it should be understood that the inventive concept can be implemented in many ways and is not limited to the particular examples described below or to the particular manner in which any features of such examples are implemented. In other instances, well-known details are not shown or described to avoid obscuring aspects of the inventive concept.

The inventive concept is disclosed from an engineering viewpoint, wherein a first quantity is said to be "equal to" a second quantity if a difference between the first quantity and the second quantity is smaller than a given tolerance. For example, 100.2 mV is said to be equal to 100 mV if the given tolerance is 0.5 mV, or another suitable design value. In other words, when it is stated: "X is equal to Y," what it means is: "X is approximately equal to Y, and a difference between X and Y is smaller than a given tolerance of interest." Likewise, in a mathematical expression, an equal sign "=" means "equal to, from the engineering viewpoint" Likewise, when it is stated: "X is identical to Y," what it means is: "there is no substantial difference between X and Y."

Figure 2A:
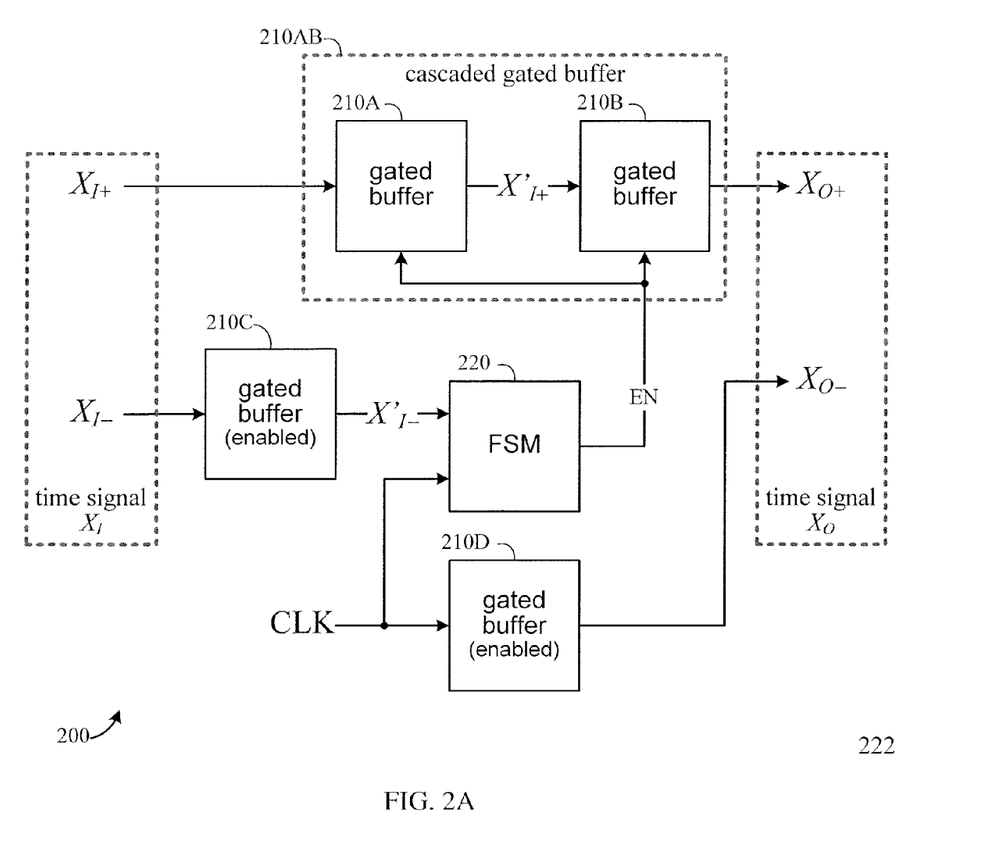
FIG. 2A shows a functional block diagram of a time shifter in accordance with an exemplary embodiment.

FIG. 2A depicts a functional block diagram of a time shifter 200 in accordance with an exemplary embodiment. The time shifter 200 is configured to receive an input time signal $X_1$ including two constituent logical signals $X_{1+}$ and $X_{1-}$ and output an output time signal $X_0$ including two constituent logical signals $X_{0+}$ and $X_{0-}$ in accordance with a clock signal CLK. Time shifter 200 includes: a cascaded gated buffer 210AB including a gated buffer 210A and a gated buffer 210B configured in a cascade topology to receive $X_{1+}$ and output $X_{0+}$ in accordance with an enabling signal EN; a gated buffer 210C configured to receive the $X_{1-}$ and output a delayed signal $X'_{1-}$; a gated buffer 210D configured to receive CLK and output $X_{0-}$; and a finite state machine (FSM) 220 configured to receive $X'_{1-}$ and CLK and output the enabling signal EN. In an exemplary embodiment, the gated buffer 210A, the gated buffer 210B, the gated buffer 210C, and the gated buffer 210D are substantially identical. However, the gated buffer 210A and the gated buffer 210B are conditionally enabled when the FSM 220 is in a state where the enabling signal EN is asserted, while the gated buffer 210C and the gated buffer 210D are enabled regardless of the state of FSM 220.

Figure 2B:
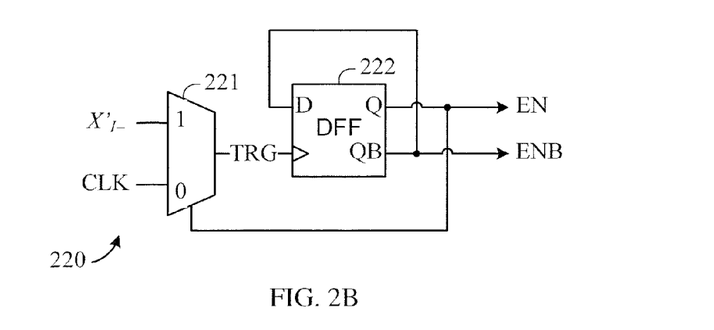
FIG. 2B shows a schematic diagram of a finite state machine in accordance with an exemplary embodiment of the time shifter of FIG. 2A.

FIG. 2B shows a schematic diagram of the FSM 220 in accordance with an exemplary embodiment. FSM 220 includes a multiplexer 221 configured to receive 1 $X'_{1-}$ and CLK and output a trigger signal TRG in accordance with the enabling signal EN; and a DFF (data flip flop) 222 configured to toggle upon a rising edge of the trigger signal TRG. DFF 222 has an input terminal labeled as "D," an output terminal labeled as "Q," a complementary output terminal labeled as "QB," and a clocking terminal labeled by a wedge symbol. These notations are widely used and their associated meanings and functions are well known to one skilled in the art and thus not described in detail here. The enabling signal EN represents a state of the FSM 220. When the enabling signal EN is asserted, $X'_{1-}$ is selected by the multiplexer 221 as the trigger signal TRG, and the enabling signal EN remains asserted until an arrival of a rising edge of $X'_{1-}$ that triggers DFF 222 to toggle and thus de-assert the enabling signal EN. When the enabling signal EN is de-asserted, CLK is selected by the multiplexer 221 as the trigger signal TRG, and the enabling signal EN is kept de-asserted until an arrival of a rising edge of CLK that triggers DFF 222 to toggle and thus assert the enabling signal EN. Here, ENB denotes a logical complement to the enabling signal EN; that is, ENB is 0 (1) when EN is 1 (0).

Figure 2C:
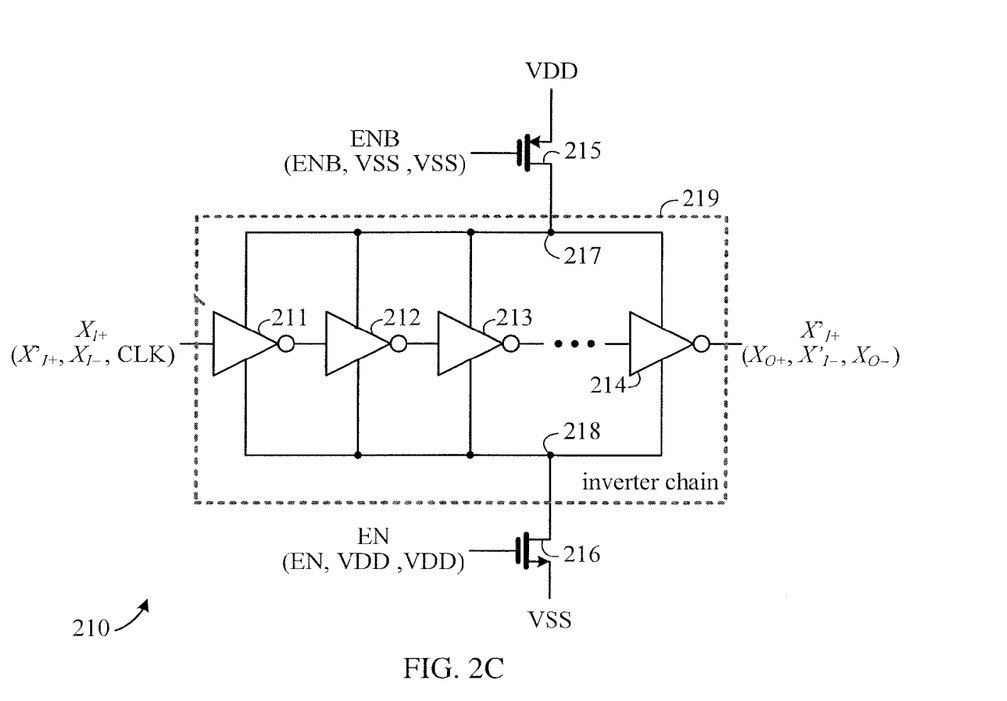
FIG. 2C shows a schematic diagram of a gated buffer in accordance with an exemplary embodiment.
Figure 2D:
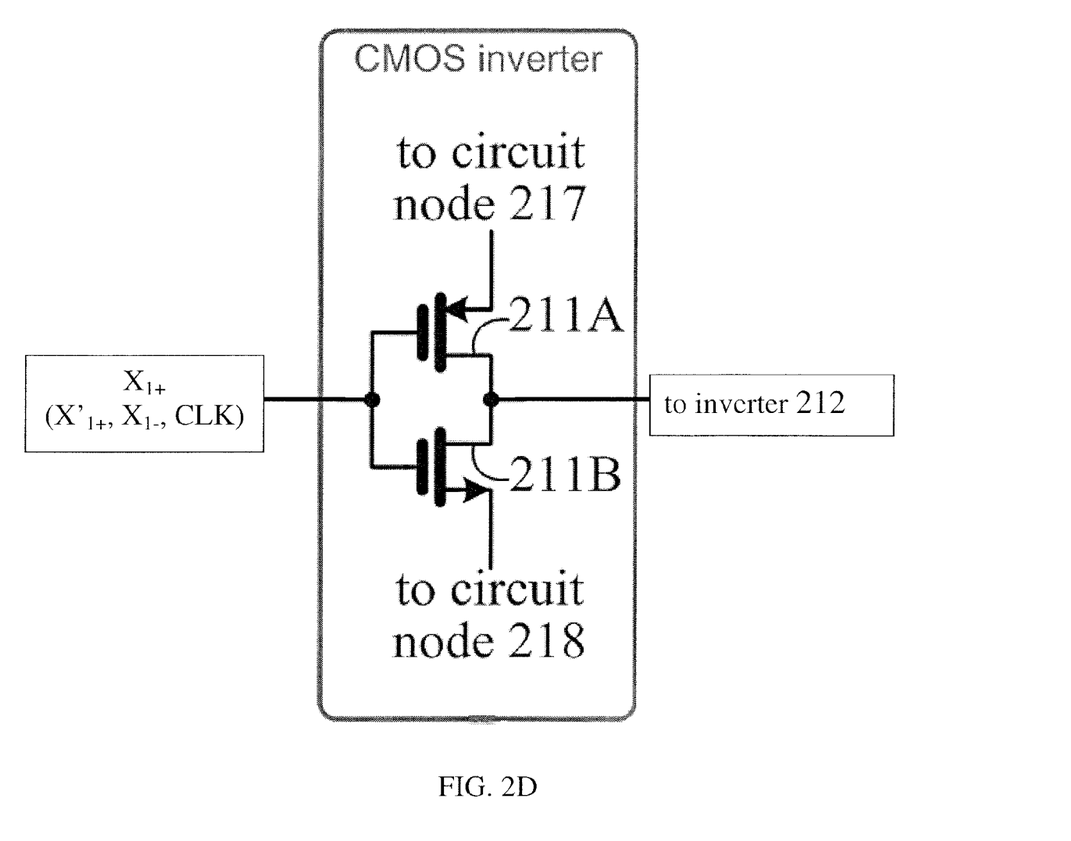
FIG. 2D shows a schematic diagram of an exemplary inverter shown in FIG. 2C.

FIG. 2C depicts a schematic diagram of a gated buffer 210 in accordance with an exemplary embodiment. Throughout this disclosure, "VDD" denotes a power supply voltage and "VSS" denotes a ground voltage; both notations are widely used and would be well-understood by one skilled in the art. The gated buffer 210 structure corresponds to an exemplary embodiment of the gated buffer 210A, the gated buffer 210B, the gated buffer 210C, and the gated buffer 210D of FIG. 2A. The gated buffer 210 includes an inverter chain 219 including a plurality of inverters 211, 212, 213, . . . , and 214 configured in a cascade topology; a NMOS transistor 216; and a PMOS transistor 215. When the gated buffer 210 corresponds to exemplary embodiments of respective gated buffer 210A (210B, 210C, 210D) of FIG. 2A, the inverter chain 219 respectively receives $X_{1+}$ ($X'_{1+}$, $X_{1-}$, CLK) and respectively outputs $X'_{1+}$ ($X_{0+}$, $X'_{1-}$, $X_{0-}$), the NMOS transistor 216 of the respective gated buffer 210A (210B, 210C and 210D) is respectively controlled by EN (EN, VDD, VDD), and the PMOS transistor 215 of the respective gated buffer 210A (210B, 210C, 210D) is respectively controlled by ENB (ENB, VSS, VSS). Each of the plurality of inverters 211, 212, 213, . . . , and 214 is a CMOS inverter including a PMOS transistor and a NMOS transistor, coupling to circuit node 217 on the power side and to circuit node 218 on the ground side. For example, inverter 211 includes a PMOS transistor 211A and a NMOS transistor 211B, with both the gate of the PMOS transistor 211A and the gate of the NMOS transistor 211B coupling to an input on the left side, both the drain of the PMOS transistor 211A and the drain of the NMOS transistor 211B coupling to an output on the right side, the source of the PMOS transistor 211A coupling to circuit node 217 on the top side, and the source of the NMOS transistor 211B coupling to circuit node 218 on the bottom side. The exemplary embodiment is further illustrated in FIG. 2D. Those of ordinary skill in the art understand what the "gate," the "source," and the "drain" of a MOS transistor are, and also understand how a CMOS inverter works, and therefore no detailed explanation is provided here. When both the PMOS transistor 215 and the NMOS transistor 216 and turned on, inverter chain 219 is powered on and the gated buffer 210 is enabled. In an exemplary embodiment, an edge of $X_{1+}$ ($X'_{1+}$, $X_{1-}$, CLK) is respectively propagating through the gated buffer 210 and eventually resulting respectively in an edge of $X'_{1+}$ ($X_{0+}$, $X'_{1-}$, $X_{0-}$) at a later time if the gated buffer 210 is enabled for a sufficiently long duration. When both the PMOS transistor 215 and the NMOS transistor 216 and turned off, inverter chain 219 is powered off and the gated buffer 210 is disabled. In an exemplary embodiment, the gated buffer 210 is "frozen," that is, the respective output voltage of each of the plurality of inverters 211, 212, 213, . . . , and 214 is held. If both the PMOS transistor 215 and the NMOS transistor 216 are turned off before the respective edge of $X_{1+}$ ($X'_{1+}$, $X_{1-}$, CLK) finishes propagating through a respective gated buffer 210, the propagation of the edge is halted but will be resumed whenever both the PMOS transistor 215 and the NMOS transistor are turned on again. The gated buffers 210C and 210D are enabled due to the gate of their respective PMOS transistor 215 being coupled to VSS and their respective gate of the NMOS transistor 216 being coupled to VDD. Therefore an edge of $X_{1-}$ and an edge of CLK will always propagate respectively through the gated buffers 210C and 210D and respectively become an edge of $X'_{1-}$ ($X_{0-}$) after a time duration of $T_{GB3}$ and $T_{GB4}$, which are respective propagation delays of the gated buffer 210C and 210D. On the other hand, the gated buffers 210A and 210B are enabled only when the enabling signal EN is asserted (and its logical complement ENB is de-asserted). Therefore, an edge of $X_{1+}$ ($X'_{1+}$) can respectively propagate through the gated buffer 210A (210B) only when the enabling signal EN is asserted. The time shifter 200 of FIG. 2A is designed such that an edge of $X_{1+}$ will not propagate through the cascaded gated buffer 210AB uninterruptedly, but will always resume to propagate upon an edge of the clock signal CLK. In this manner, the time signal $X_1$ is shifted in accordance with the clock signal CLK.

To make sure that the gated buffer 210 of FIG. 2C introduces a propagation delay without polarity inversion, the total number of cascaded inverters in inverter chain 219 must be an even number, since an odd number of cascaded inverters will introduce a polarity inversion.

Figure 2E:
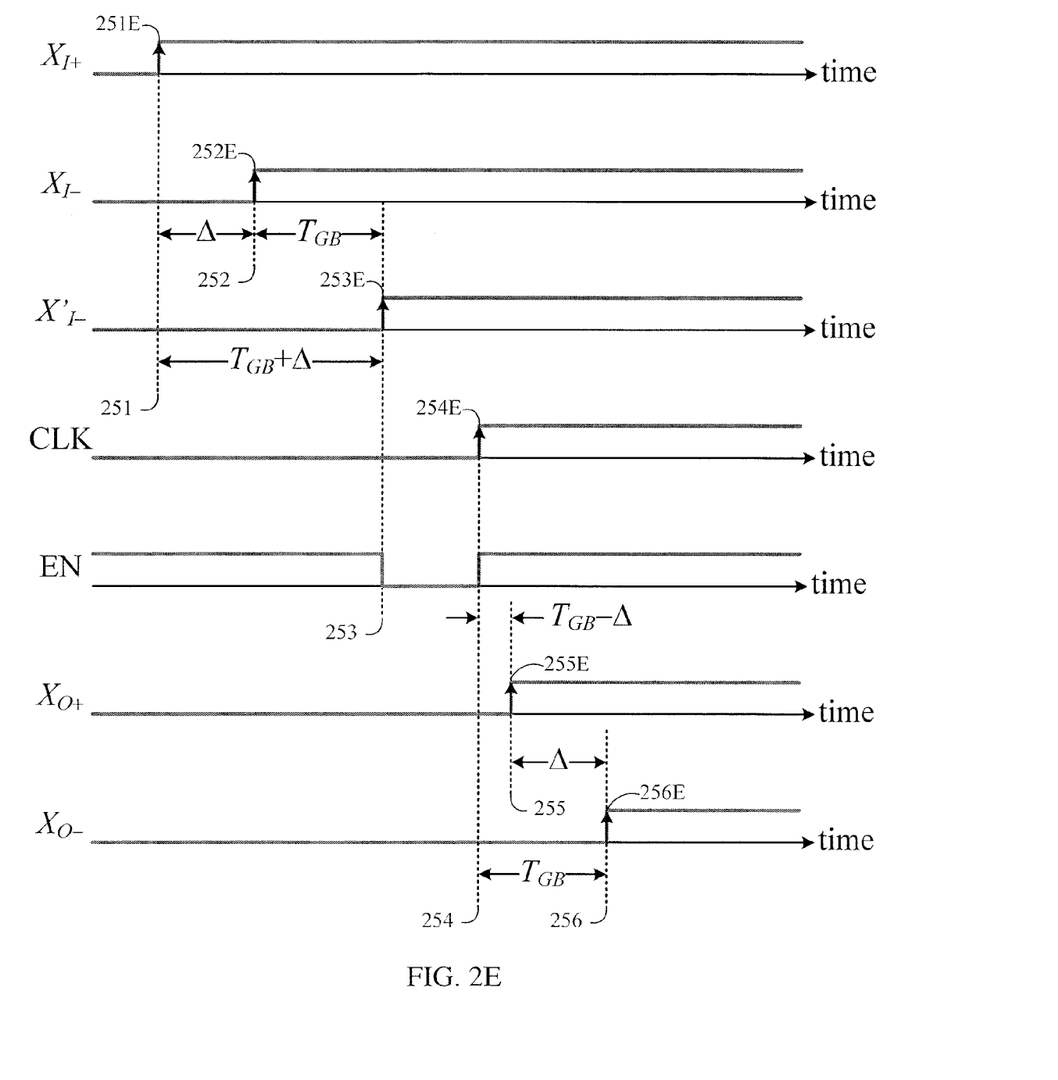
FIG. 2E shows an exemplary timing diagram of the time shifter of FIG. 2A.

In an exemplary embodiment where the four gated buffers 210A, 210B, 210C, and 210D are identical, they have the same propagation delay (when they are enabled). For purposes of further explanation of an exemplary embodiment, assume a propagation delay of $T_{SB}$. An exemplary timing diagram of the time shifter 200 of FIG. 2A is shown in FIG. 2E. The enabling signal EN is originally asserted. Time signal component $X_{1+}$ has a rising edge 251E at time instant 251, while $X_{1-}$ has a rising edge 252E at time instant 252. The difference between time instant 252 and time instant 251 is Δ, which is a value of the input time signal $X_1$. The rising edge 252E of $X_{1-}$ propagates through the gated buffer 210C, resulting in a rising edge 253E of $X'_{1-}$ at time instant 253. The difference between time instant 253 and time instant 252 is $T_{GB}$, since the propagation delay of the gated buffer 210C is $T_{GB}$. The rising edge 253E of $X'_{1-}$ triggers the FSM 220 to toggle at time instant 253, and therefore the enabling signal EN is de-asserted at time instant 253. As a result, the propagation of the rising edge 251E of $X_{1+}$ along the cascaded gated buffer 210AB is halted at time instant 253. However, at time instant 253, the rising edge 251E of $X_{1+}$ has already propagated for a total time of $T_{GB}$+Δ. The clock signal CLK has a rising edge 254E at time instant 254, which triggers the FSM 220 to toggle again and therefore the enabling signal EN is asserted again at time instant 254. This prompts the propagation of the rising edge 251E of $X_{1+}$ along the cascaded gated buffer 210AB to resume. Since the total propagation delay of the cascaded gated buffer 210AB is $2T_{GB}$, it takes an additional time of $2T_{GB}-(T_{GB}+Δ)$, which is $T_{GB}-Δ$, for the rising edge 251E of $X_{1+}$ to finish propagating through the cascaded gated buffer 210AB. When the rising edge 251E of $X_{1+}$ finishes propagating through the cascaded gated buffer 210AB at time instant 255, it results in a rising edge 255E of $X_{0+}$. The difference between time instant 255 and time instant 254 is $T_{GB}-Δ$, since it is the time that the rising edge 251E of $X_{1+}$ takes to finish propagating through the cascaded gated buffer 210AB after the propagation is resumed at time instant 254. Lastly, the rising edge 254E of the clock signal CLK 254 propagates through the gated buffer 210D, resulting in a rising edge 256E of $X_{0-}$ at time instant 256. The difference between time instant 256 and time instant 254 is $T_{GB}$, since it is the time it takes for the rising edge 254E of the CLK signal to propagate through the gated buffer 210D. The difference between time instant 256 and time instant 255 is thus Δ. Therefore, a value of the output time signal $X_0$ is equal to a value of the input time signal $X_1$. Since $X_{0-}$ is the same as the clock signal CLK except for a propagation delay $T_{GB}$, the time shifter 200 shifts the input time signal $X_1$ into the output time signal $X_0$ in accordance with a timing determined by the clock signal CLK while preserving the value of the input signal $X_1$.

Note that the four gated buffers 210A, 210B, 210C, and 210D are identical is exemplary but is not a necessary condition for the time shifter 200 of FIG. 2A to work functionally. When the condition fails to hold, the time shifter 200 may still work functionally but a range of a value of the input time signal $X_1$ that the time shifter 200 can properly handle may be reduced.

The cascaded gated buffer 210AB can also be described and illustrated as one single gated buffer with a double amount of propagation delay. In an exemplary embodiment, the gated buffer is described and illustrated as a cascade of the first gated buffer 210A and the second gated buffer 210B to make it clear that a propagation delay of the cascaded gated buffer 210AB is twice of a propagation delay of the gated buffer 210C and 210D.

Figure 2F:
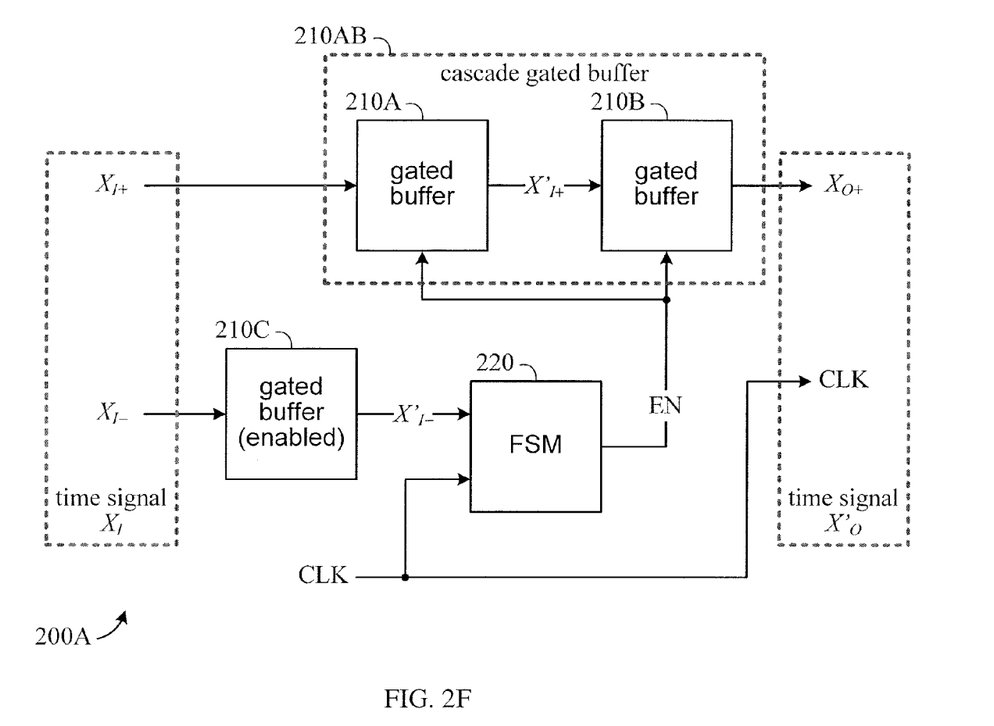
FIG. 2F shows a functional block diagram of an offset time shifter in accordance with an exemplary embodiment.

A further embodiment is referred to as "offset time shifter" 200A and is shown in FIG. 2F. The offset time shifter 200A is exactly the same as the time shifter 200 of FIG. 2A except that the gated buffer 210D is removed (or bypassed), and the clock signal CLK is directly used to replace the logical signal $X_{0-}$, resulting in an alternative output time signal $X'_0$. In this exemplary embodiment, the value of the alternative output time signal $X'_0$ is equal to the value of the input time signal $X_1$ minus the propagation delay $T_{GB}$, which is a constant offset.

Figure 3A:
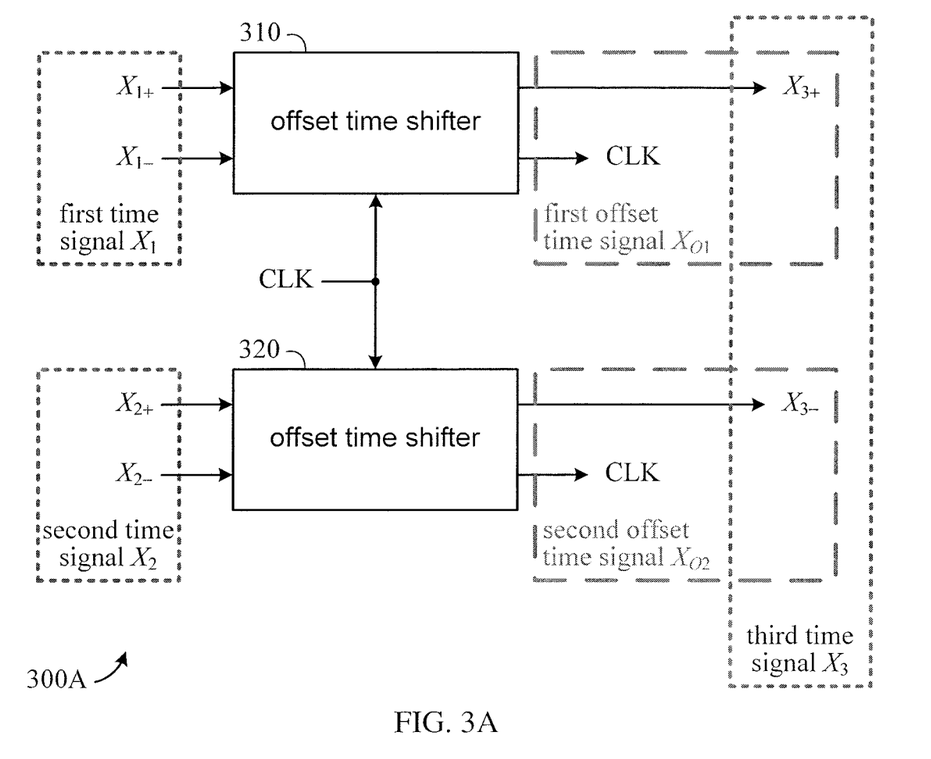
FIG. 3A shows a schematic diagram of a time adder in accordance with an exemplary embodiment.

The offset time shifter 200A of FIG. 2F can be used to embody a time adder. FIG. 3A shows a functional block diagram of a time adder 300A in accordance with an exemplary embodiment. Time adder 300A includes: a first offset time shifter 310 configured to receive a first time signal $X_1$ including two constituent logical signals $X_{1+}$ and $X_{1-}$ and outputs a logical signal $X_{3+}$ in accordance with a clock signal CLK, wherein $X_{3+}$ and the clock signal CLK forms a first offset time signal $X_{01}$; and a second offset time shifter 320 configured to receive a second time signal $X_2$ including two constituent logical signals $X_{2+}$ and $X_{2-}$ and output a logical signal $X_{3-}$ in accordance with the clock signal CLK, wherein $X_{3-}$ and the clock signal CLK forms a second offset time signal $X_{02}$. Here, the circuit of the offset time shifter 200A of FIG. 2F is used to as an exemplary corresponding structure for both the first offset time shifter 310 and the second offset time shifter 320. For further explanation of an exemplary embodiment, let a value of the first time signal $X_1$ be $\Delta_1$, and let a value of the second time signal $X_2$ be $\Delta_2$. As explained earlier, a value of the first offset time signal $X_{01}$ is $\Delta_1 - T_{GB}$, and a value of the second offset time signal $X_{02}$ is $\Delta_2 - T_{GB}$. Therefore, a timing difference between the clock signal CLK and $X_{3+}$ is $\Delta_1 - T_{GB}$, and a timing difference between the clock signal CLK and $X_{3-}$ is $\Delta_2 - T_{GB}$. Therefore, a timing difference between $X_{3-}$ and the logical signal $X_{3+}$ is $\Delta_1 - \Delta_2$. Therefore, $X_{3+}$ and $X_{3-}$ together form a third timing signal $X_3$ whose value is $\Delta_1 - \Delta_2$. Time adder 300A therefore receives the first time signal $X_1$ and the second time signal $X_2$ and outputs the third time signal $X_3$ such that the value of the third time signal $X_3$ is equal to the value of the first time signal $X_1$ minus the value of the second time signal $X_2$. The time adder 300 thus effectively subtracts the second time signal $X_2$ from the first time signal $X_1$.

Figure 3B:
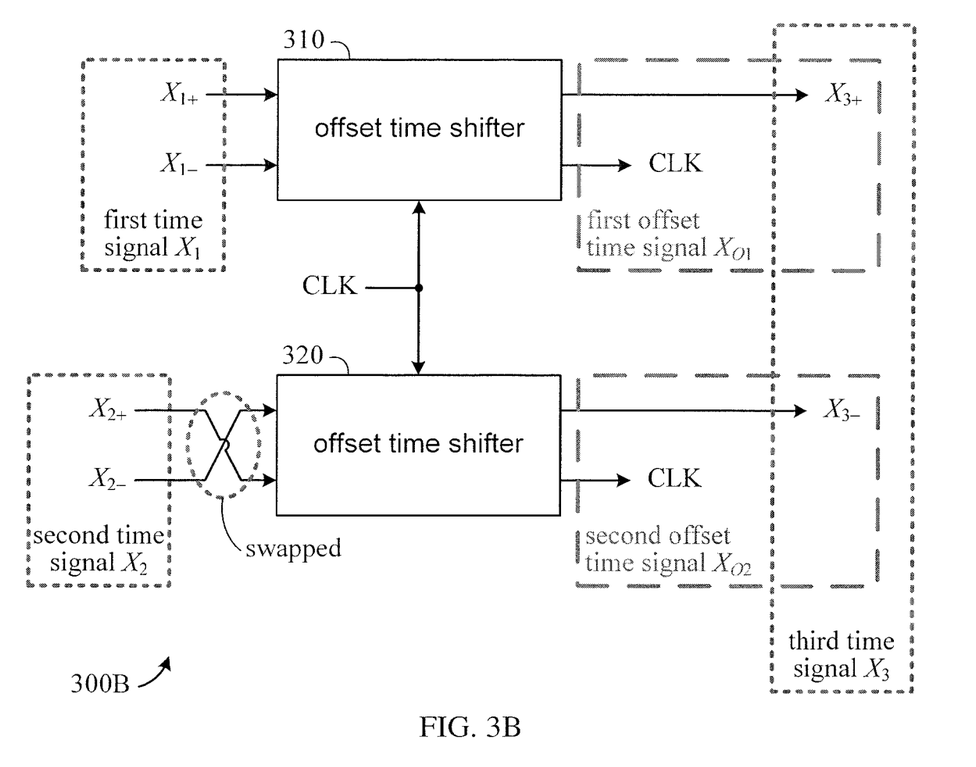
FIG. 3B shows a schematic diagram of an alternative time adder in accordance with a further embodiment.

In a further exemplary embodiment, a schematic diagram of an exemplary time adder 300B is shown FIG. 3B. The exemplary time adder 300B is exactly the same as the time adder 300A of FIG. 3A, except that the two constituent logical signals $X_{2+}$ and $X_{2-}$ are swapped before they are received by the second offset time shifter 320. Due to the swap, the value of the third time signal $X_3$ is equal to the value of the first time signal $X_1$ plus the value of the second time signal $X_2$. The exemplary time adder 300B therefore receives the first time signal $X_1$ and the second time signal $X_2$ and output the third time signal $X_3$ such that the value of the third time signal $X_3$ is equal to the value of the first time signal $X_1$ plus the value of the second time signal $X_2$.

Those skilled in the art will readily observe that numerous modifications and alterations of the device and method may be made while retaining the teachings of the inventive concept. Accordingly, the above disclosure should not be construed to limit the invention. Rather, the scope of the inventive concept is described by the appended claims and equivalents thereof.

What is claimed is:

1. A circuit comprising:
a first gated buffer configured to receive a first logical signal and output a second logical signal; a second gated buffer configured to receive a third logical signal and output a delayed signal; and a finite state machine configured to receive the delayed signal and a clock signal, wherein the first gated buffer is configured to be conditionally enabled in accordance with a state of the finite state machine, while the second gated buffer is configured to be enabled regardless of the state of the finite state machine.

2. The circuit of claim 1, wherein the first gated buffer comprises: a plurality of CMOS (complementary metal oxide semiconductor) inverters configured in a cascade topology; a PMOS (p-channel metal oxide semiconductor) transistor configured to couple the plurality of CMOS inverters to a power supply node; and a NMOS (n-channel metal oxide semiconductor) transistor configured to couple the plurality of CMOS inverters to a ground node, wherein the PMOS transistor and the NMOS transistor are configured to be conditionally turned on in accordance with the state of the finite state machine.

3. The circuit of claim 1, wherein the second gated buffer comprises: a plurality of CMOS (complementary metal oxide semiconductor) inverters configured in a cascade topology; a PMOS (p-channel metal oxide semiconductor) transistor configured to couple the plurality of CMOS inverters to a power supply node; and a NMOS (n-channel metal oxide semiconductor) transistor configured to couple the plurality of CMOS inverters to a ground node, wherein the PMOS transistor and the NMOS transistor are configured to be turned on regardless of the state of the finite state machine.

4. The circuit of claim 1, wherein the finite state machine enters a first state upon an edge of the clock signal, and enters a second state upon an edge of the delayed signal.

5. The circuit of claim 4, wherein the first gated butter is enabled when the finite state machine is in the first state, and disabled when the finite state machine is in the second state.

6. The circuit of claim 1, further comprising a third gated buffer configured to receive the clock signal and output a fourth logical signal, wherein the third gated buffer is configured to be enabled regardless of the state of the finite state machine.

7. The circuit of claim 1, wherein the first logical signal and the third logical signal are swapped before being received by the circuit.

8. A method comprising:
receiving a first logical signal, generating a second logical signal by propagating the first logical signal through a first gated buffer, receiving a clock signal;
receiving a third logical signal;
generating a delayed signal by propagating the third logical signal through a second gated buffer;
placing a finite state machine in a first state upon an edge of the clock signal; and
placing the finite state machine in a second state upon an edge of the delayed signal;
wherein the first gated buffer is enabled when the finite state machine is in the first state but the first gated buffer is disabled when the finite state machine is in the second state, while the second gated buffer is enabled when the finite state machine is in the first state and when the finite state machine is in the second state.

9. The method of claim 8, wherein the first gated buffer comprises: a plurality of CMOS (complementary metal oxide semiconductor) inverters configured in a cascade topology; a PMOS (p-channel metal oxide semiconductor) transistor configured to couple the plurality of CMOS inverters to a power supply node; and a NMOS (n-channel metal oxide semiconductor) transistor configured to couple the plurality of CMOS inverters to a ground node, wherein the PMOS transistor and the NMOS transistor are configured to be turned on when the finite state machine is in the first state but turned off when the finite state machine is in the second state.

10. The method of claim 8, wherein the second gated buffer comprises: a plurality of CMOS (complementary metal oxide semiconductor) inverters configured in a cascade topology; a PMOS (p-channel metal oxide semiconductor) transistor configured to couple the plurality of CMOS inverters to a power supply node; and a NMOS (n-channel metal oxide semiconductor) transistor configured to couple the plurality of CMOS inverters to a ground node, wherein the PMOS transistor and the NMOS transistor are configured to be turned on when the finite state machine is in the first state and when the finite state machine is in the second state.

11. The method of claim 8 further comprising: generating a fourth logical signal by propagating the clock signal through a third gated buffer that is turned on when the finite state machine is in the first state and when the finite state machine is in the second state.

* * * * *